(12) United States Patent
Ishida (10) Patent No.: US 10,560,066 B2
(45) Date of Patent: Feb. 11, 2020

(54) ELECTRONIC COMPONENT

(71) Applicant: Murata Manufacturing Co., Ltd., Kyoto (JP)

(72) Inventor: Kosuke Ishida, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 15/636,704

(22) Filed: Jun. 29, 2017

(65) Prior Publication Data

US 2018/0061670 A1    Mar. 1, 2018

(30) Foreign Application Priority Data

Aug. 24, 2016  (JP) .................. 2016-163568

(51) Int. Cl.
*H03H 7/01* (2006.01)
*H01G 4/232* (2006.01)
(Continued)

(52) U.S. Cl.
CPC ....... *H03H 7/0115* (2013.01); *B32B 37/0007* (2013.01); *H01F 17/0013* (2013.01); *H01F 27/292* (2013.01); *H01G 2/06* (2013.01); *H01G 4/232* (2013.01); *H01G 4/2325* (2013.01); *H01G 4/30* (2013.01); *H01G 4/40* (2013.01); *H01L 21/4857* (2013.01); *H01L 23/50* (2013.01); *H05K 7/10* (2013.01); *H05K 7/1038* (2013.01); *B32B 2307/732* (2013.01); *B32B 2457/00* (2013.01); *H01F 2017/0066* (2013.01);
(Continued)

(58) Field of Classification Search
CPC .......... H03H 2001/0085; H03H 7/0115; H01L 21/4857
USPC .................................. 333/185, 175
See application file for complete search history.

(56) References Cited

U.S. PATENT DOCUMENTS 7,023,299 B2    4/2006  Shoji
2005/0116793 A1*  6/2005  Shoji ..................... H03H 7/427
                                                    333/185
(Continued)

FOREIGN PATENT DOCUMENTS

CN        1622233 A     6/2005
JP     2006-237080 A    9/2006
(Continued)

OTHER PUBLICATIONS

JP2007-059533 Foreign Translation (Year: 2007).*
(Continued)

*Primary Examiner* — Rakesh B Patel
(74) *Attorney, Agent, or Firm* — Studebaker & Brackett PC (57) ABSTRACT

An electronic component capable of downsizing and narrowing of a mounting space. The electronic component includes: a laminated body made up of a plurality of laminated insulator layers and having an upper surface and a bottom surface; a plurality of inner conductors disposed in the laminated body; and a plurality of terminal electrodes electrically connected to the plurality of inner conductors and exposed from the laminated body. The electronic component has a plurality of recesses formed on a bottom surface of the laminated body. The plurality of terminal electrodes includes first conductive parts formed on wall surfaces of the plurality of recesses.

9 Claims, 12 Drawing Sheets

(51) Int. Cl.
*H01G 4/40* (2006.01)
*H01G 2/06* (2006.01)
*H01F 17/00* (2006.01)
*H01F 27/29* (2006.01)
*B32B 37/00* (2006.01)
*H01G 4/30* (2006.01)
*H01L 21/48* (2006.01)
*H01L 23/50* (2006.01)
*H05K 7/10* (2006.01)
*H01L 23/498* (2006.01)
*H03H 1/00* (2006.01)

(52) U.S. Cl.
CPC .. *H01L 23/49805* (2013.01); *H01L 23/49822* (2013.01); *H03H 2001/0085* (2013.01)

(56) References Cited

U.S. PATENT DOCUMENTS

2011/0291790 A1  12/2011  Okumura et al.
2014/0145796 A1*  5/2014  Okumura ............ H03H 7/09
                                                    333/177
2015/0091685 A1  4/2015  Kitajima

FOREIGN PATENT DOCUMENTS

JP   2012-015494 A   1/2012
JP   2015-070122 A   4/2015

OTHER PUBLICATIONS

An Office Action; "Notification of Reasons for Refusal," Mailed by the Japanese Patent Office dated Jan. 8, 2019, which corresponds to Japanese Patent Application No. 2016-163568 and is related to U.S. Appl. No. 15/636,704; with English language translation.

* cited by examiner

PRIOR ART

ELECTRONIC COMPONENT

CROSS REFERENCE TO RELATED APPLICATIONS

This application claims benefit of priority to Japanese Patent Application 2016-163568 filed Aug. 24, 2016, the entire content of which is incorporated herein by reference.

TECHNICAL FIELD

The present disclosure relates to an electronic component, and more particularly, to an electronic component having a laminated structure.

BACKGROUND

Figure 9:
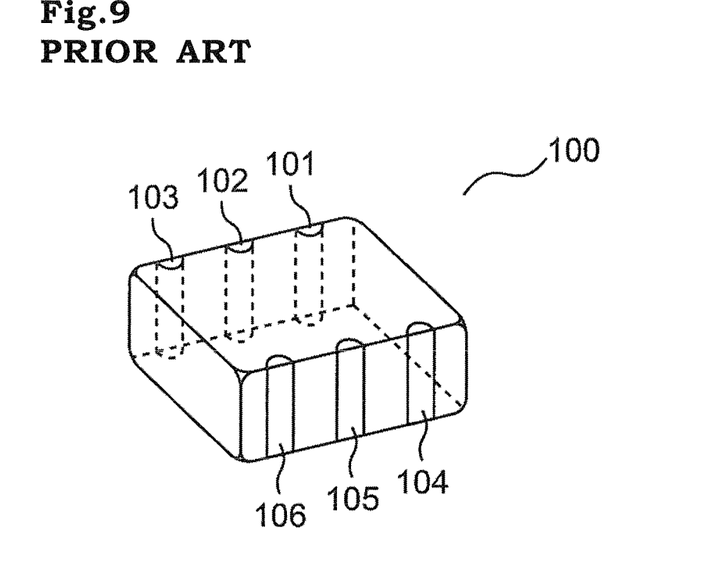
FIG. 9 is a schematic perspective view of an example of a structure of a laminate constituting a conventional electronic component.
Figure 10:
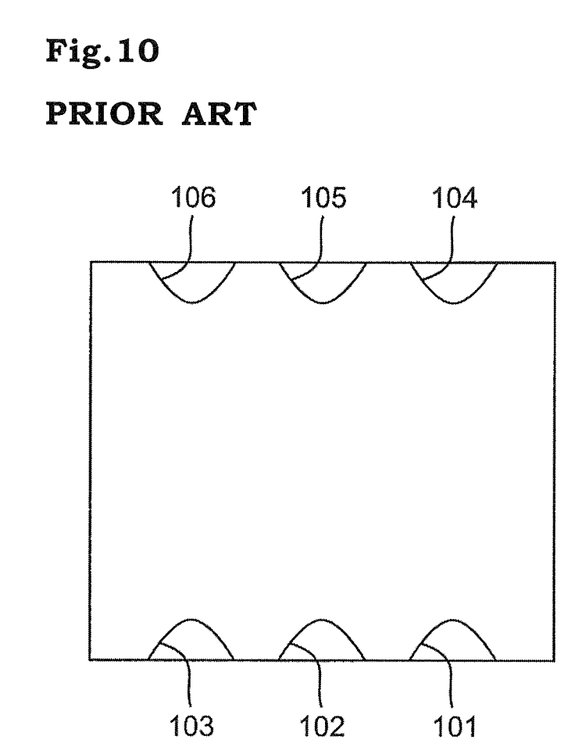
FIG. 10 is a bottom view of the laminated body of FIG. 9.

For example, a common mode choke coil described in Japanese Laid-Open Patent Publication No. 2006-237080 is known as an electronic component having a laminated structure. FIG. 9 is a schematic perspective view of the structure of the common mode choke coil. The common mode choke coil includes a rectangular parallelepiped laminated body 100 made up of a plurality of laminated insulators, three coils (not shown) located in the laminated body 100 and magnetically coupled to each other, and six terminal electrodes 101 to 106 formed on side surfaces of the laminated body 100 and electrically connected to the end portions of the respective coils. FIG. 10 is a bottom view of the laminated body 100, and the six terminal electrodes 101 to 106 are each exposed on the bottom surface. For the three terminal electrodes formed on the same side surface, a pair of signal terminal electrodes (e.g., 101, 103) is arranged with one ground terminal electrode (e.g., 102) interposed therebetween. This common mode choke coil is solder-bonded to a mounting land of a circuit board so as to form a solder fillet and is mounted on the circuit board.

On the other hand, in association with recent miniaturization of electronic devices, the demand for miniaturization has been created also for an electronic component having a laminated structure (hereinafter also referred to as a laminated electronic component) mounted on a circuit board. Particularly, because of the necessity to mount a number of electronic components on a circuit board to be miniaturized, it is necessary not only to reduce the size of the laminated electronic component but also to narrow a mounting space from the viewpoint of ensuring a mounting space for other electronic components.

SUMMARY

Problem to be Solved by the Disclosure

However, an electronic component having terminal electrodes on side surfaces of a laminated body as described in Japanese Laid-Open Patent Publication No. 2006-237080 has a problem that it is difficult to downsize the electronic component and narrow the mounting space.

It is therefore an object of the present disclosure is to provide an electronic component capable of the downsizing and the narrowing of the mounting space.

Means for Solving Problem

To solve the problem, an aspect of the present disclosure provides an electronic component comprising:

a laminated body made up of a plurality of laminated insulator layers and having an upper surface and a bottom surface;

a plurality of inner conductors disposed in the laminated body; and a plurality of terminal electrodes electrically connected to the plurality of inner conductors and exposed from the laminated body, the electronic component having a plurality of recesses formed on a bottom surface of the laminated body, the plurality of terminal electrodes including first conductive parts formed on wall surfaces of the plurality of recesses.

According to the aspect, the electronic component can be made smaller.

According to another aspect, the laminated body has a rectangular parallelepiped shape, and the plurality of recesses include recesses formed at four corners of the bottom surface of the laminated body.

According to the aspect, pitches between the recesses can be made larger by providing the recesses at the four corners, so that a space of an internal circuit can be increased.

According to another aspect, the plurality of recesses includes a recess formed at the center of the bottom surface of the laminated body.

According to the aspect, pitches to the recesses at the four corners can be maximized by providing the recess at the center.

According to another aspect, the recesses formed at the four corners are cutout recesses.

According to the aspect, the recesses can be provided at positions constituting the outer edge by forming the cutout recesses, so that the space of the internal circuit can further be increased.

According to another aspect, the terminal electrodes further include second conductive parts extending around openings of the recesses and electrically connecting to the first conductive parts.

According to the aspect, the bonding strength can further be improved at the time of mounting.

According to another aspect, the recesses have a reverse taper cross-sectional shape expanding toward the opening.

According to the aspect, solder more easily enters the recesses at the time of mounting so that the bonding strength of the electronic component can be increased. Additionally, the electronic component is more easily positioned at the time of mounting so that the occurrence of positional shift and tilt can be reduced. Since formation of a solder fillet can further be restrained on the outside of the electronic component main body, the mounting space can further be narrowed.

According to another aspect, the plurality of inner conductors constitutes at least one type of an element selected from the group consisting of a coil, a capacitor, and a resistor.

According to the aspect, a mounting space of a passive component can be narrowed.

According to another aspect, the plurality of inner conductors constitutes a plurality of elements.

According to the aspect, the mounting space can be narrowed by integration into one chip.

According to another aspect, at least a portion of the plurality of internal conductors constitutes a coil, and the bottom surface side of the laminated body is a magnetic substrate.

According to the aspect, the mounting space can be narrowed and the inductance can be improved.

According to another aspect, the plurality of recesses includes a recess formed at the center of the bottom surface of the laminated body; at least a portion of the plurality of internal conductors constitutes at least two or more sets of coils and capacitors electrically connected in series; and the electrodes of the capacitors on the side not connected to the coils are connected to the terminal electrode corresponding to the recess formed at the center of the bottom surface.

According to the aspect, the terminal electrode connected to one end side of the capacitors is commonalized to reduce the number of terminals so that the mounting space can be narrowed.

Effect of the Disclosure

The present disclosure enables the provision of the electronic component capable of the downsizing and the narrowing of the mounting space.

DETAILED DESCRIPTION

An embodiment of an electronic component according to an aspect of the present disclosure will now be described with reference to the drawings.

First Embodiment

The electronic component of this embodiment includes a laminated body made up of a plurality of laminated insulator layers and having an upper surface and a bottom surface, a plurality of inner conductors disposed in the laminated body, and a plurality of terminal electrodes electrically connected to the plurality of inner conductors and exposed from the laminated body, and has a plurality of recesses formed on a bottom surface of the laminated body, and the plurality of terminal electrodes includes first conductive parts formed on wall surfaces of the plurality of recesses.

Figure 1:
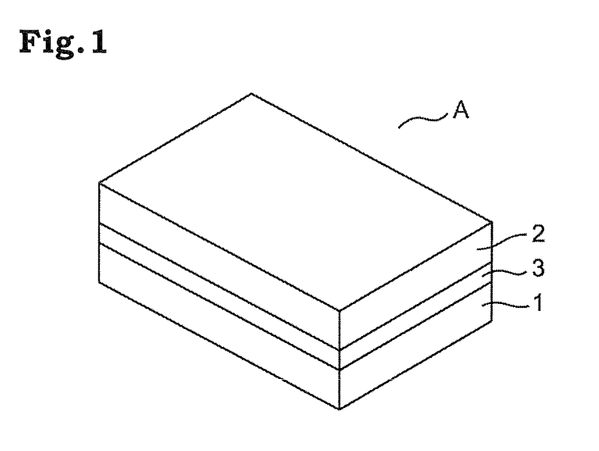
FIG. 1 is a schematic perspective view of an example of a structure of a laminated body constituting an electronic component according to an embodiment of the present disclosure.

FIG. 1 is a schematic perspective view of an example of a structure of an electronic component according to this embodiment. The electronic component is made up of a laminated body A including an insulator layer 1, an insulator layer 3, and an insulator layer 2. The laminated body A has an upper surface and a bottom surface and has a rectangular parallelepiped shape in this example.

Figure 2:
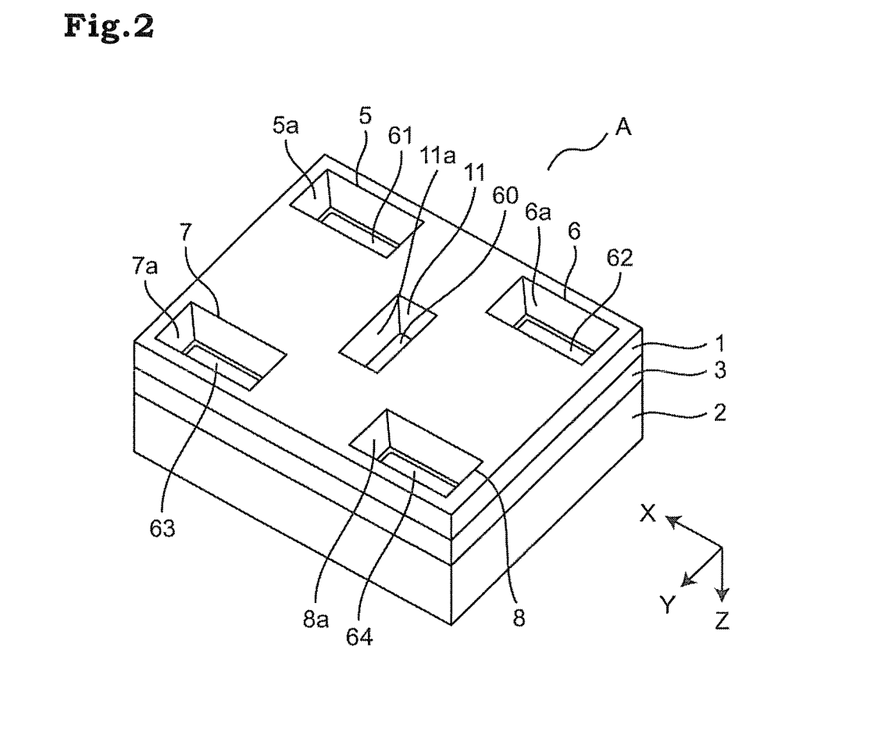
FIG. 2 is a bottom perspective view of the laminated body shown in FIG. 1.

FIG. 2 is a bottom perspective view of the laminated body A. On the bottom surface, a plurality of recesses is formed, including four recesses 61, 62, 63, 64 formed at four corners and one recess 60 formed at the center of the bottom surface. One ground terminal electrode 11 is formed in the recess 60 at the center of the bottom surface, and signal terminal electrodes 5, 6, 7, 8 are respectively formed in the recesses 61, 62, 63, 64 at the four corners of the bottom surface. A first conductive part 11a is formed on a wall surface of the recess 60 at the center of the bottom surface, and first conductive parts 5a, 6a, 7a, 8a are respectively formed on wall surfaces of the recesses 61, 62, 63, 64 at the four corners. The signal terminal electrodes 5, 7 constitute a pair of signal terminal electrodes for input and output, and the signal terminal electrodes 6, 8 constitute another pair of signal terminal electrodes for input and output. Although the first conductive parts are not limited in terms of the shape and size thereof as long as the parts are electrically connected to the plurality of inner conductors, for example, the first conductive parts are conductive layers each formed on at least a portion of a wall surface, or preferably the entire wall surface, of a recess, and FIG. 2 shows an example of using a conductive layer formed on the entire wall surface of a recess. The bottom surface of the laminated body A is a mounting surface to be mounted on a mounting board. Assuming that the lamination direction of the insulator layer 1, the insulator layer 3, and the insulator layer 2 is a Z direction, the mounting surface is defined as the bottom surface. In a plane orthogonal to the Z direction, one side direction is defined as an X direction and the other side direction is defined as a Y direction.

Although the arrangement of the ground terminal electrode and the signal terminal electrodes is not particularly limited, four signal terminal electrodes are preferably arranged at substantially equal intervals around one ground terminal electrode as described above. Since a plurality of terminal electrodes can be arranged in a narrower region while ensuring intervals between the terminal electrodes, the electronic component can be made smaller.

Figure 3:
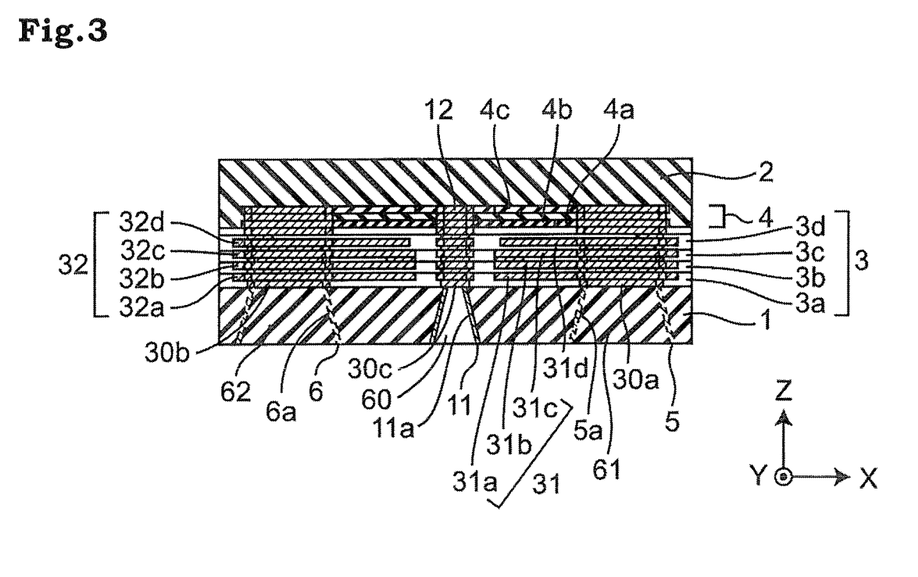
FIG. 3 is a schematic longitudinal sectional view of FIG. 1.
Figure 4A:
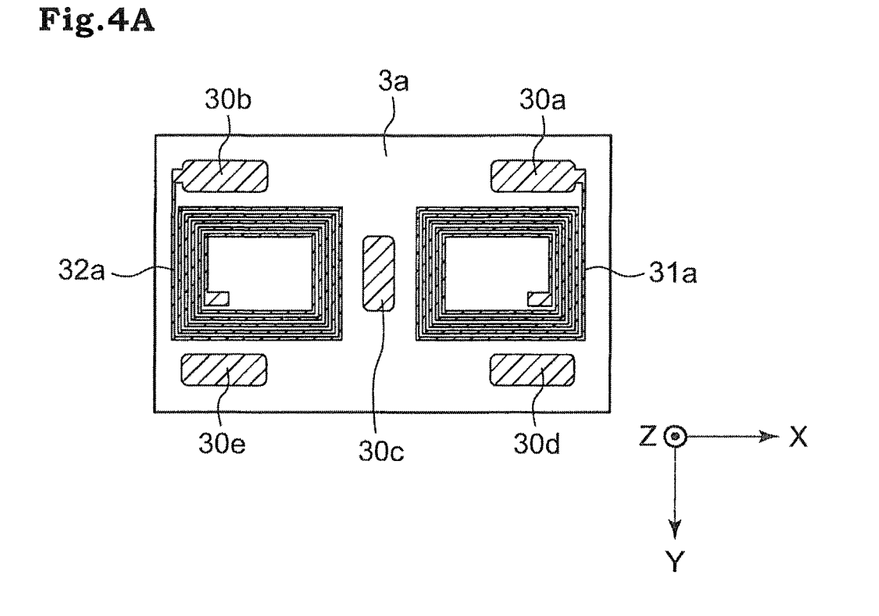
FIG. 4A is a plane view of a first coil conductor of a first coil element and a second coil element in the laminated body shown in FIG. 1.
Figure 4B:
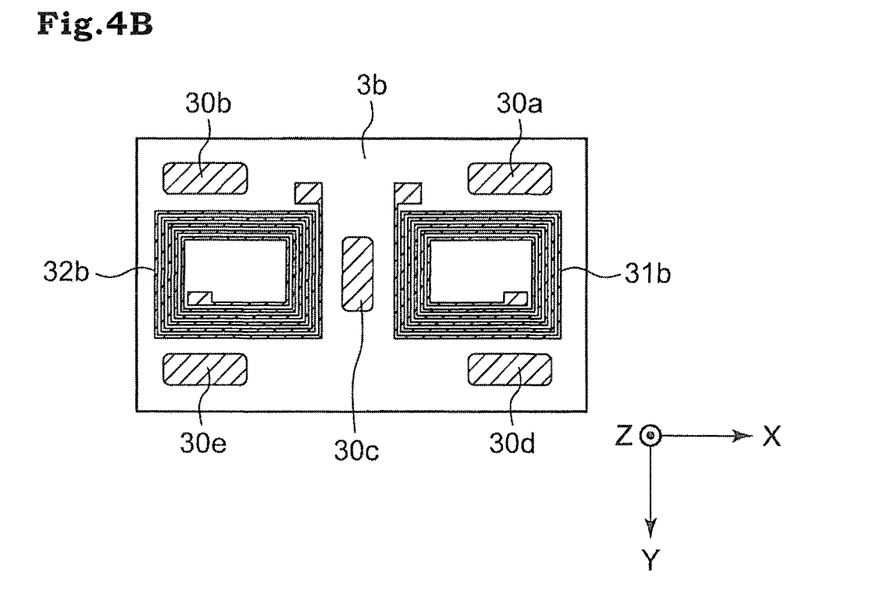
FIG. 4B is a plane view of a second coil conductor of the first coil element and the second coil element in the laminated body shown in FIG. 1.
Figure 4C:
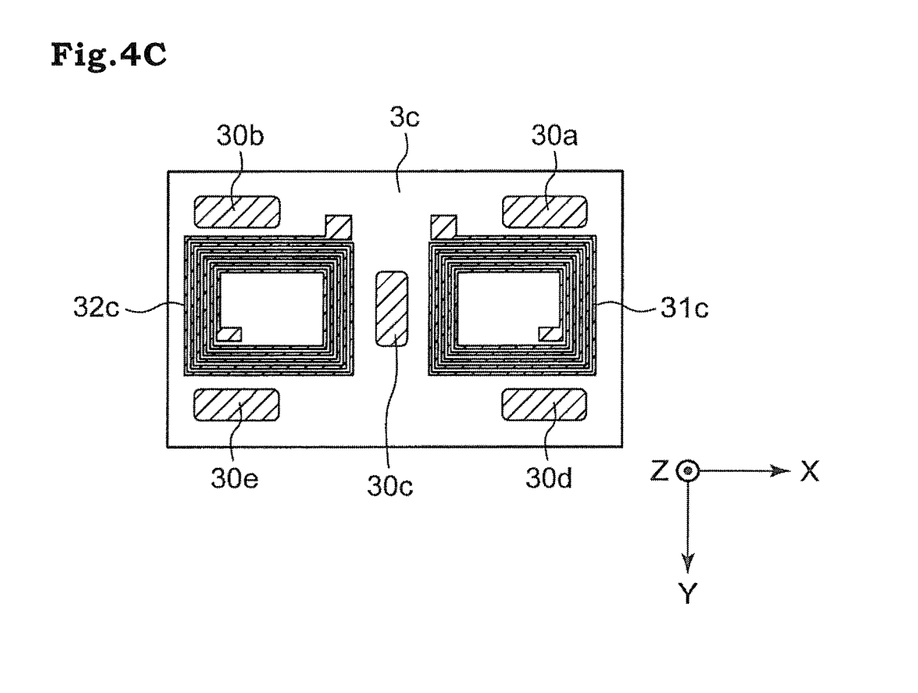
FIG. 4C is a plane view of a third coil conductor of the first coil element and the second coil element in the laminated body shown in FIG. 1.
Figure 4D:
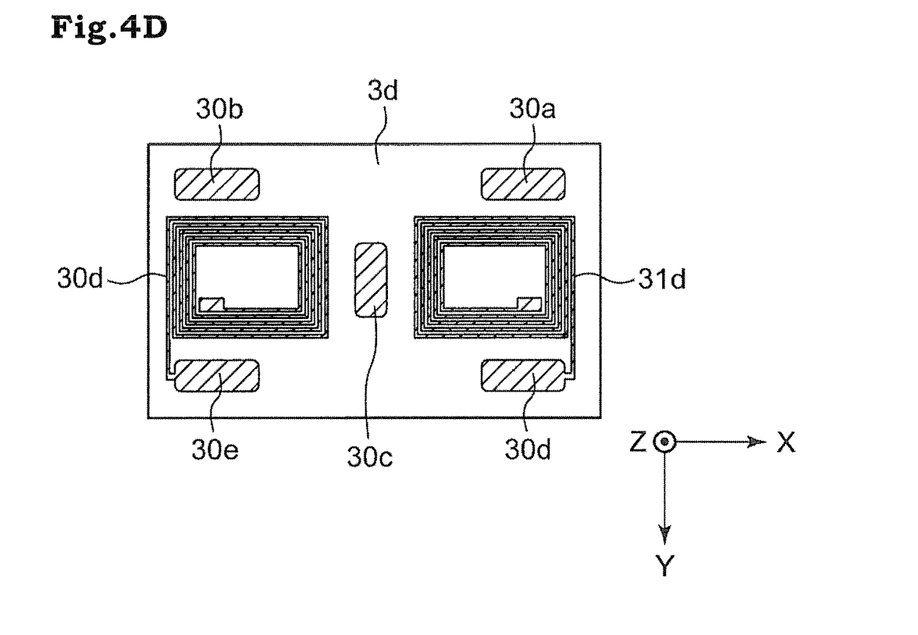
FIG. 4D is a plane view of a fourth coil conductor of the first coil element and the second coil element in the laminated body shown in FIG. 1.
Figure 5A:
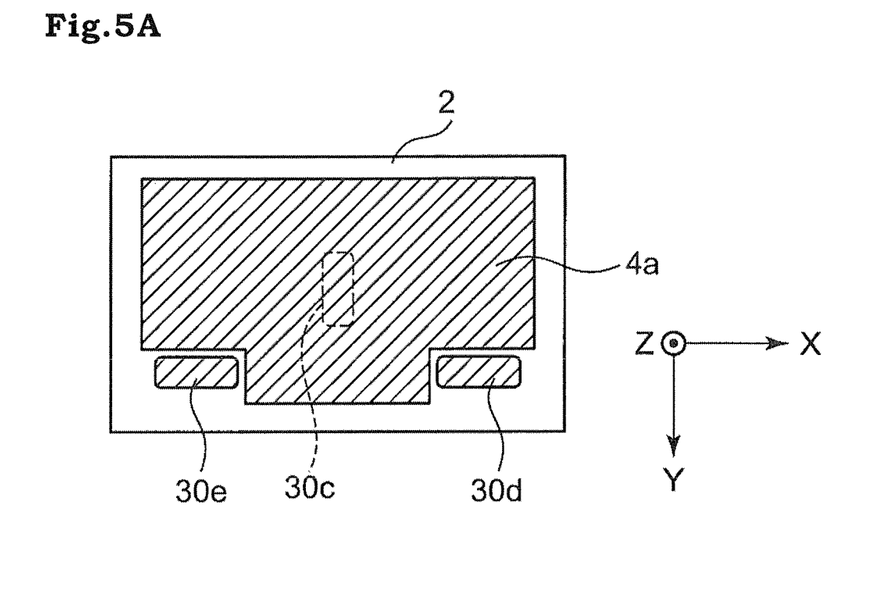
FIG. 5A is a plane view of a first electrode plate of a capacitor element in the laminated body shown in FIG. 1.
Figure 5B:
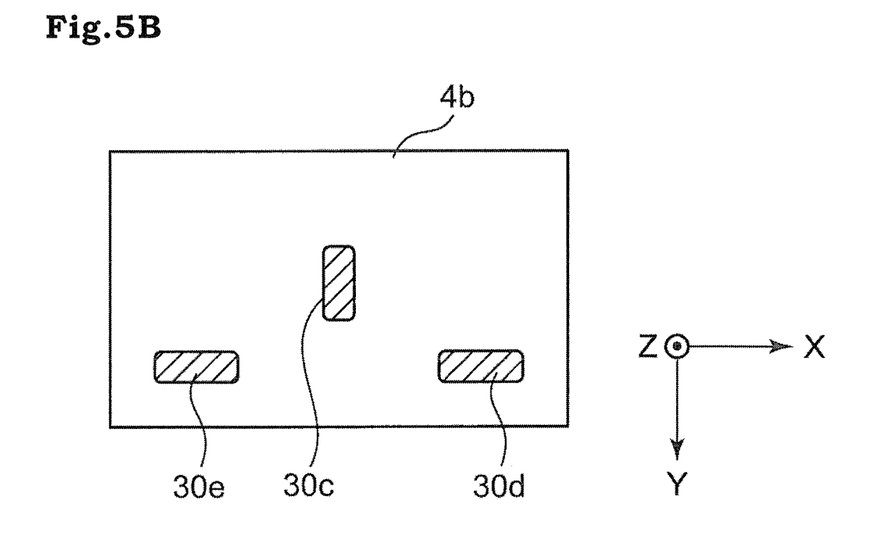
FIG. 5B is a plane view between the first electrode plate and a second electrode plate of the capacitor element in the laminated body shown in FIG. 1.
Figure 5C:
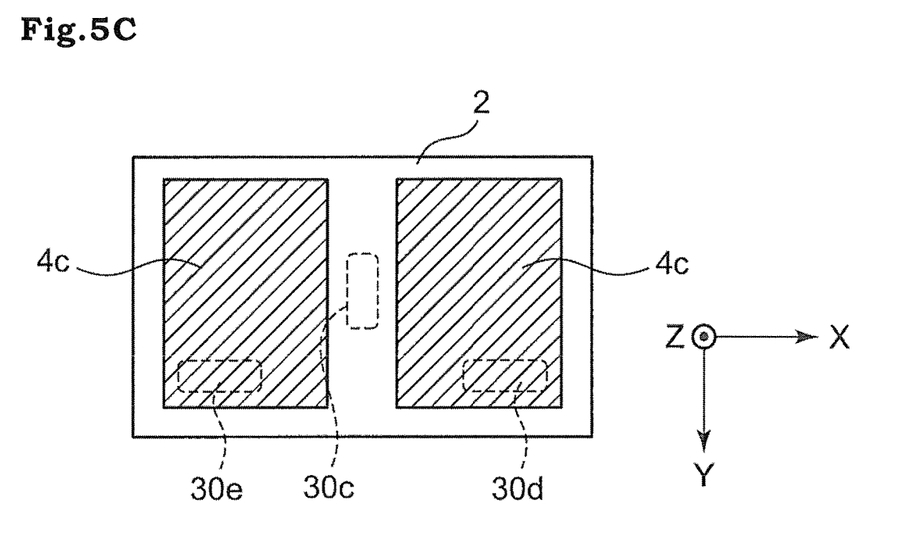
FIG. 5C is a plane view of the second electrode plate of the capacitor element in the laminated body shown in FIG. 1.

FIG. 3 is a schematic longitudinal sectional view of the laminated body A. The insulator layer 3 is disposed between the insulator layer 1 and the insulator layer 2. On the lower layer side of the insulator layer 2, a capacitor element 4 described later including a dielectric layer is buried. In the insulator layer 1 on the bottom surface side of the laminated body A, the ground terminal electrode 11 and the signal terminal electrodes 5, 6 are formed. The insulator layer 3 includes a plurality of insulator layers 3a, 3b, 3c, 3d. In this embodiment, a first coil element 31 and a second coil element 32 are disposed in a region in which the insulator layer 3 is formed. The capacitor element 4 has a structure in which a first electrode plate 4a and a second electrode plate 4c disposed in the insulator layer 2 face each other across a dielectric layer 4b, and the dielectric layer 4b is a portion of the insulator layer 2.

As shown in FIGS. 3 and 4A to 4D, the first coil element 31 includes a first coil conductor 31a, a second coil conductor 31b, a third coil conductor 31c, and a fourth coil conductor 31d laminated in order from a lower layer to an upper layer. The first to fourth coil conductors 31a, 31b, 31c, 31d are inner conductors wound and arranged on the insulator layers 3a, 3b, 3c, 3d constituting the insulator layer 3.

An outer circumferential end of the first coil conductor 31a is connected to a signal electrode 30a. The first coil conductor 31a is wound clockwise from the outer circumferential end to an inner circumferential end. The inner circumferential end of the first coil conductor 31a is connected through a via conductor to an inner circumferential end of the second coil conductor 31b. The second coil conductor 31b is wound clockwise from the inner circumferential end to an outer circumferential end. The outer circumferential end of the second coil conductor 31b is connected through a via conductor to an outer circumferential end of the third coil conductor 31c. The third coil conductor 31c is wound clockwise from the outer circumferential end to an inner circumferential end. The inner circumferential end of the third coil conductor 31c is connected through a via conductor to an inner circumferential end of the fourth coil conductor 31d. The fourth coil conductor 31d is wound clockwise from the inner circumferential end to an outer circumferential end. The outer circumferential end of the fourth coil conductor 31d is connected to a signal electrode 30d.

The second coil element 32 includes a first coil conductor 32a, a second coil conductor 32b, a third coil conductor 32c, and a fourth coil conductor 32d laminated in order from a lower layer to an upper layer. The first to fourth coil conductors 32a, 32b, 32c, 32d are inner conductors wound and arranged on the insulator layers 3a, 3b, 3c, 3d constituting the insulator layer 3.

An outer circumferential end of the first coil conductor 32a is connected to a signal electrode 30b. The first coil conductor 32a is wound counterclockwise from the outer circumferential end to an inner circumferential end. The inner circumferential end of the first coil conductor 32a is connected through a via conductor to an inner circumferential end of the second coil conductor 32b. The second coil conductor 32b is wound counterclockwise from the inner circumferential end to an outer circumferential end. The outer circumferential end of the second coil conductor 32b is connected through a via conductor to an outer circumferential end of the third coil conductor 32c. The third coil conductor 32c is wound counterclockwise from the outer circumferential end toward an inner circumferential end. The inner circumferential end of the third coil conductor 32c is connected through a via conductor to an inner circumferential end of the fourth coil conductor 32d. The fourth coil conductor 32d is wound counterclockwise from the inner circumferential end to an outer circumferential end. The outer circumferential end of the fourth coil conductor 32d is connected to a signal electrode 30e.

The first coil conductor 31a, the second coil conductor 31b, the third coil conductor 31c, and the fourth coil conductor 31d of the first coil element 31 are concentrically arranged. The first coil conductor 32a, the second coil conductor 32b, the third coil conductor 32c, and the fourth coil conductor 32d of the second coil element 32 are concentrically arranged. The axis of the first coil element 31 and the axis of the second coil element 32 are orthogonal to the bottom surface of the laminated body A. The axis of the first coil element 31 and the axis of the second coil element 32 are arranged in parallel.

As shown in FIGS. 3 and 5A to 5C, the capacitor element 4 includes the first electrode plate 4a and the second electrode plate 4c that are inner conductors laminated in order from a lower layer to an upper layer via the dielectric layer 4b. The dielectric layer 4b is a portion of the insulator layer 2. The second electrode plate 4c is in the form of two plates respectively connected to the signal electrode 30d and the signal electrode 30e. The first electrode plate 4a is connected to a signal electrode 30c.

The signal electrodes 30a, 30b, 30c, 30d, 30e are each extended in the lamination direction and disposed in the insulator layers 2, 3. When viewed in the Z direction, the signal electrode 30a is overlapped with the signal terminal electrode 5 and connected to the signal terminal electrode 5. The signal electrode 30b is overlapped with the signal terminal electrode 6 and connected to the signal terminal electrode 6. The signal electrode 30c is overlapped with the ground terminal electrode 11 and connected to the ground terminal electrode 11. The signal electrode 30d is overlapped with the signal terminal electrode 7 and connected to the signal terminal electrode 7. The signal electrode 30e is overlapped with the signal terminal electrode 8 and connected to the signal terminal electrode 8.

The ground terminal electrode and the signal terminal electrodes are formed in the recesses formed on the bottom surface of the laminated body A. The recesses have a reverse taper cross-sectional shape expanding toward the opening.

Figure 6:
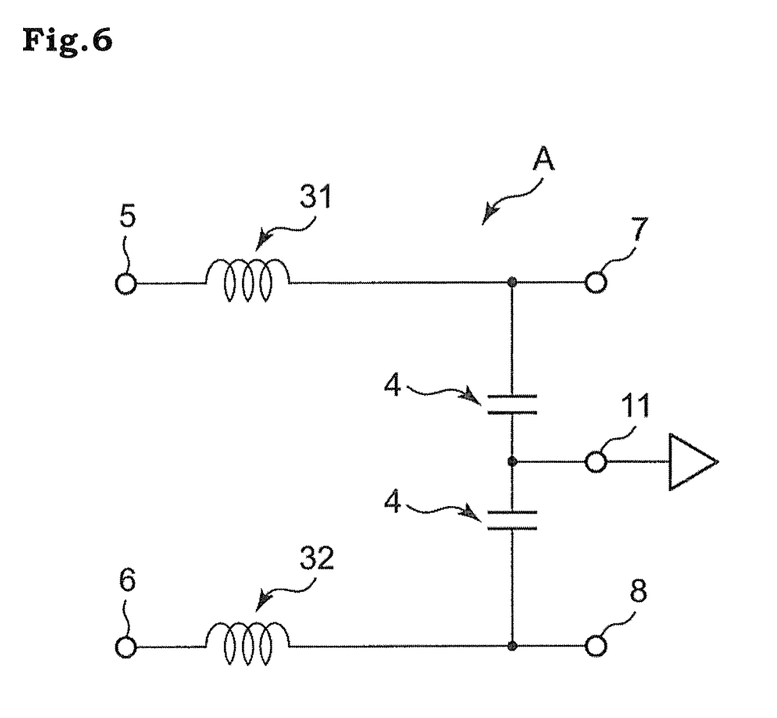
FIG. 6 is an equivalent circuit diagram of an electronic component made up of the laminated body of FIG. 1.

FIG. 6 is an equivalent circuit diagram of the electronic component (the laminated body A) according to this embodiment. The laminated body A is an LC composite type electronic component including the first coil element 31, the second coil element 32, and the capacitor element 4. Specifically, for example, respective signals are input to the signal terminal electrodes 5, 6 of the laminated body A. The signals respectively pass through the first coil element 31 and the second coil element 32 and are output from the signal terminal electrodes 7, 8. Additionally, the laminated body A has the capacitor elements 4 respectively connected in parallel to signal lines through which the signals pass, and the capacitor elements 4 are connected, on the side thereof not connected to the signal lines (the side not connected to the coil elements 31, 32), to the common ground terminal electrode 11. In this way, the laminated body A has a configuration having two L-shaped LC filter circuits made up of coil elements electrically connected in series and capacitor elements connected in parallel to signal lines. The laminated body A is mounted on an electronic device such as a personal computer, a DVD player, a digital camera, a TV, a portable telephone, and automotive electronics. The laminated body A is used as an LC filter such as a low-pass filter, a high-pass filter, a band-pass filter, and a trap filter, for example.

A method of manufacturing the laminated body A will be described with reference to FIG. 3.

A magnetic substrate, for example, a ferrite substrate is provided as the insulator layer 1. The insulator layer 3*a* made of an insulating resin is formed on the ferrite substrate by a photolithography method. On the insulator layer 3*a* and the ferrite substrate exposed from the insulator layer 3*a*, a conductive metal film, for example, a metal film made of Ag, Cu, Au, or an alloy mainly composed thereof is formed by sputtering. Subsequently, a photoresist is formed on a portion in which an inner conductor serving as a coil conductor, a signal electrode, and an interlayer connecting conductor (via conductor) are formed. Etching is then performed to remove the conductive metal film except the portion in which the inner conductor, the signal electrode, and the interlayer connection conductor are formed (the portion covered with the photoresist). Subsequently, the photoresist is removed by an organic solvent to form the inner conductor, the signal electrode, and the interlayer connection conductor on the insulator layer 3*a*. This process is repeated to form the insulator layer 3 (the coil element) including the insulator layers 3*b* to 3*d*, the inner conductors, the signal electrodes, and the interlayer connection conductors.

Subsequently, the insulator layer 2 and the capacitor element 4 are formed on the insulator layer 3. Specifically, for example, a conductive metal film and an insulating resin are alternately formed on the insulator layer 3 and appropriately patterned to form the insulator layer 2 including the dielectric layer 4*b*, the first and second electrode plates 4*a*, 4*c*, and the signal electrodes 30*c* to 30*d*. A plurality of recesses is then formed in the insulator layer 1 by using a laser or by blasting. Conductive metal films are formed on the wall surfaces of the recesses to form the ground terminal electrode and the signal terminal electrodes. The conductive metal film can be formed not only by a sputtering method but also by a plating method or a printing method using a paste containing a conductive metal powder.

For the insulator layer 1, a magnetic substrate can be used. The magnetic substrate may be a ferrite substrate. Alternatively, the substrate can be acquired by firing a ceramics substrate of alumina etc. or a resin layer coated with a paste containing a ferrite calcined powder or a metal magnetic powder. The paste may be used as the insulator layer 1. For the insulator layers 2, 3, an insulating resin such as polyimide or a magnetic resin acquired by containing a magnetic powder in an insulating resin can be used.

Although the method of manufacturing the laminated body A has been described with the example of using a photolithography method, the method is not limited thereto and can be achieved by using a method in which a plurality of insulator green sheets having inner conductors formed on surfaces is laminated and integrated by firing. Although the formation of the wiring pattern has been described with the example of using the subtract method, an additive method is also usable.

Since the electronic component according to this embodiment includes the first conductive parts having the terminal electrodes formed on the wall surfaces of the recesses, solder enters the recesses at the time of mounting and, therefore, an amount of solder spreading to the outside of the electronic component can be reduced, so that the mounting space can be narrowed. Additionally, since the terminal electrodes are provided on the inner walls of the recesses, the solder forms a fillet along each of the wall surfaces of the recesses at the time of mounting and, therefore, a sufficient bonding strength can be ensured, so that the reliability can be improved. Moreover, since the solder enters the recesses, the electronic component can be reduced in mounting height so as to achieve a lower height. Since a conventional electronic component comes into contact with the solder on the bottom surface at the time of mounting, a force is applied to the electronic component vertically upward as a buoyant force from the molten solder, and a tilt or a shift may occur during mounting. On the other hand, since the electronic component according to this embodiment allows the solder to enter the recesses at the time of mounting, the solder comes into contact with the inner walls of the recesses and such a buoyant force is hardly transmitted to the electronic component, so that a tilt or a shift hardly occurs during mounting.

Since at least a portion of the plurality of inner conductors constitutes a coil and the bottom surface side of the laminated body is a magnetic substrate, the bottom surface side of the laminated body having the constituted coil is the magnetic substrate with a high magnetic permeability, so that the inductance of the coil can be improved.

The plurality of recesses includes a recess formed at the center of the bottom surface of the laminated body; at least a portion of the plurality of inner conductors constitutes at least two or more sets of coils and capacitors electrically connected in series; the electrodes of the capacitors on the side not connected to the coils are connected to the terminal electrode corresponding to the recess formed at the center of the bottom surface; and, therefore, in the configuration having two or more sets of coils and capacitors constituting an LC filter, the ground terminal electrodes of the capacitors are commonalized in the recess at the center of the bottom surface of the laminated body to reduce the number of terminals of the laminated body so that the mounting space can be narrowed.

Second Embodiment

Figure 7:
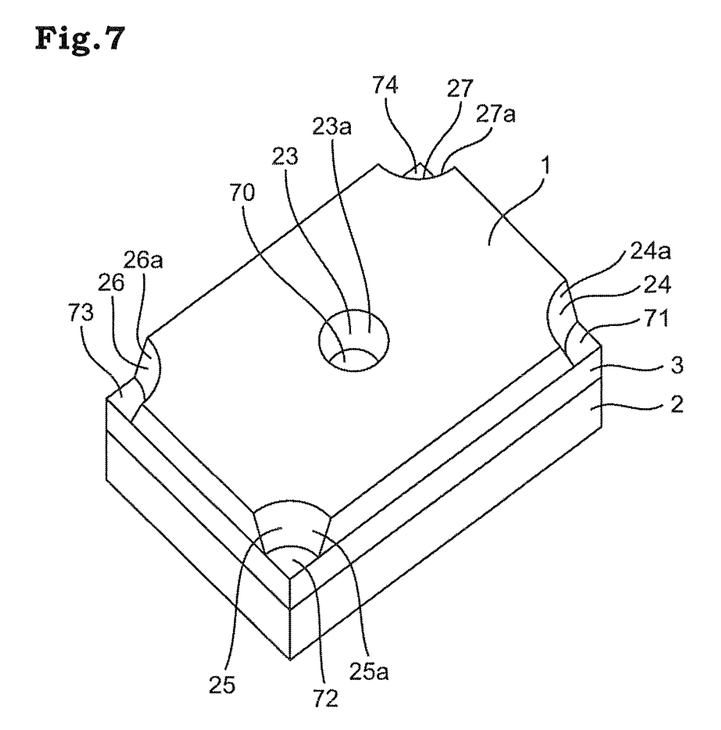
FIG. 7 is a bottom perspective view of a structure of a laminated body according to another embodiment of the present disclosure.

This embodiment has the same configuration as the first embodiment except that a plurality of recesses includes cutout recesses formed at four corners of the bottom surface of the laminated body and at least one recess formed at a position other than the four corners. FIG. 7 shows an example thereof, and a plurality of recesses is formed on the bottom surface, including four cutout recesses 71, 72, 73, 74 formed at four corners and one recess 70 formed at the center of the bottom surface. One ground terminal electrode 23 is formed in the recess 70 at the center of the bottom surface, and four signal terminal electrodes 24, 25, 26, 27 are formed in the cutout recesses 71, 72, 73, 74 at the four corners of the bottom surface. A first conductive part 23*a* is formed on a wall surface of the recess 70 at the center of the bottom surface, and first conductive parts 24*a*, 25*a*, 26*a*, 27*a* are respectively formed on wall surfaces of the cutout recesses 71, 72, 73, 74 at the four corners.

In addition to the effects of the first embodiment, this embodiment has the effect that a space of an internal circuit can be increased by forming the recesses at the four corners as the cutout recesses, i.e., by shifting the recesses outward to the positions constituting an outer edge. As a result, the electric characteristics of the electronic component can further be improved.

Third Embodiment

Figure 8:
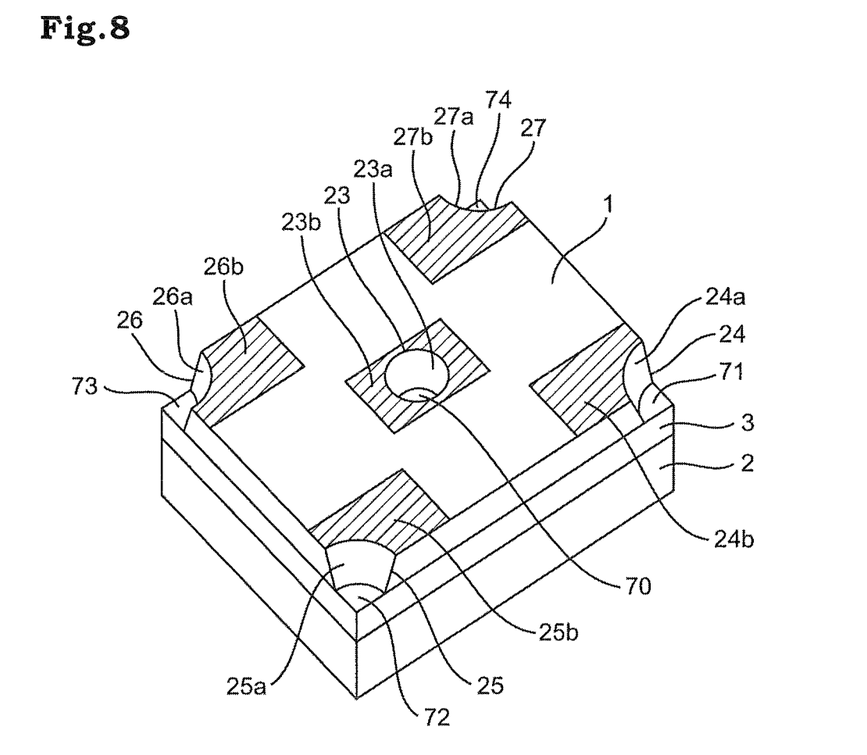
FIG. 8 is a bottom perspective view of a structure of a laminated body according to another embodiment of the present disclosure.

This embodiment has the same configuration as the second embodiment except that a terminal electrode further includes a second conductive part extending around an opening of a recess and electrically connecting to a first conductive part. FIG. 8 shows an example thereof and the ground terminal electrode 23 has a second conductive part 23b extending around the opening of the recess 70 and electrically connecting to the first conductive part 23a. The signal terminal electrodes 24, 25, 26, 27 respectively have second conductive parts 24b, 25b, 26b, 27b.

According to this embodiment, in addition to the effects of the first and second embodiments, the contact area between the terminal electrodes and the solder is increased by the second conductive parts 23b to 27b, so that the bonding strength is further improved. Additionally, when the electrical characteristics are measured, it is not necessary to insert a measurement terminal into a recess and the measurement terminal can be brought into surface contact with a terminal electrode on the bottom surface, so that the connection with a measurement device can easily be made at the time of manufacturing of the electronic component.

In the first to third embodiments, the terminal electrodes have been described with the example of using four signal terminal electrodes and one ground electrode; however, a higher number of signal terminal electrodes and ground terminal electrodes can be used by further increasing the numbers of insulator layers and inner conductors. The number of recesses may be two or more. The places of formation of the recesses are not limited to the four corners of the bottom. If the recesses are formed at the four corners of the bottom surface, the recess at the center may not be included, may be located other than at the center, and may be one of a plurality of recesses rather than a single recess. In the first to third embodiments, the example of the inner conductors constituting a coil element and a capacitor element has been described; however, the inner conductors may constitute a resistor element. The electronic component according to the present embodiment is applicable to a composite electronic component such as an LC composite electronic component, an LR composite electronic component, and an LCR composite electronic component. Since the inner conductors constitute a plurality of elements in this way, the plurality of elements can be integrated in the laminated body (into one chip) and the mounting space can be narrowed as compared to the case that each element is made up of an individual laminated body.

The invention claimed is:

1. An electronic component comprising:
   a laminated body made up of a plurality of laminated insulator layers and having an upper surface and a bottom surface, the laminated body having a plurality of recesses formed on the bottom surface thereof;
   a plurality of inner conductors disposed in the laminated body; and
   a plurality of terminal electrodes electrically connected to the plurality of inner conductors and exposed from the laminated body, the plurality of terminal electrodes including first conductive parts formed on wall surfaces of the plurality of recesses, wherein
   the plurality of recesses include a recess formed at a center of the bottom surface of the laminated body.

2. The electronic component according to claim 1, wherein the laminated body has a rectangular parallelepiped shape, and wherein the plurality of recesses include recesses formed at four corners of the bottom surface of the laminated body.

3. The electronic component according to claim 2, wherein the recesses formed at the four corners are cutout recesses.

4. The electronic component according to claim 1, wherein at least one of the plurality of recesses has a reverse taper cross-sectional shape expanding toward an opening on the bottom surface of the laminated body.

5. The electronic component according to claim 1, wherein the plurality of terminal electrodes further include second conductive parts which extend around openings of the plurality of recesses and electrically connect to the first conductive parts.

6. The electronic component according to claim 1, wherein the plurality of inner conductors constitute at least one type of an element selected from the group consisting of a coil, a capacitor, and a resistor.

7. The electronic component according to claim 6, wherein the plurality of inner conductors constitute a plurality of elements.

8. The electronic component according to claim 6, wherein at least a portion of the plurality of internal conductors constitutes a coil, and wherein a bottom surface side of the laminated body is a magnetic substrate.

9. The electronic component according to claim 6, wherein at least a portion of the plurality of internal conductors constitutes at least two or more sets of coils and capacitors electrically connected in series, and wherein an electrode of each of the capacitors on a side not connected to a respective one of the coils is connected to the terminal electrode corresponding to the recess formed at the center of the bottom surface.

* * * * *